US007321197B2

(12) United States Patent
Nakayama et al.

(10) Patent No.: US 7,321,197 B2
(45) Date of Patent: Jan. 22, 2008

(54) HIGH-EFFICIENCY ORGANIC LIGHT EMITTING ELEMENT

(75) Inventors: Takahiro Nakayama, Hitachinaka (JP); Hajime Murakami, Tomobe (JP); Masao Shimizu, Hitachi (JP)

(73) Assignee: Hitachi Displays, Ltd., Chiba (JP)

(*) Notice: Subject to any disclaimer, the term of this patent is extended or adjusted under 35 U.S.C. 154(b) by 491 days.

(21) Appl. No.: 10/924,750

(22) Filed: Aug. 23, 2004

(65) Prior Publication Data

US 2005/0236982 A1    Oct. 27, 2005

(30) Foreign Application Priority Data

Aug. 27, 2003    (JP) .............................. 2003-303051
Mar. 29, 2004    (JP) .............................. 2004-094009

(51) Int. Cl.
    *H01J 1/62*    (2006.01)
(52) U.S. Cl. ...................... 313/506; 313/498; 313/504

(58) Field of Classification Search ................ 313/498, 313/504, 506, 512
See application file for complete search history.

(56) References Cited

FOREIGN PATENT DOCUMENTS

JP    08-213174    8/1996
JP    2002-231054    8/2002

*Primary Examiner*—Vip Patel
(74) *Attorney, Agent, or Firm*—Hogan & Hartson LLP (57) ABSTRACT

By adopting the structure of this invention in which a transparent electrically conductive film is used in both of anode 202A and cathode 202B of an organic light emitting element having a hole transporting layer 203, a light emitting layer 204, an electron transporting layer 205 and an electron injecting layer 206, providing films having a light reflecting function 201 and 207 on the outside of the anode and cathode, and thereby making the gap between them function as a light vibrator, there can be obtained an organic light emitting element with which the above-mentioned two problems can be solved simultaneously.

8 Claims, 10 Drawing Sheets

4,4'-bis(N-(1-naphthyl)-N-phenyl-amino)biphenyl
(α-NPD)

4,4'-N,N'-dicarbozole-biphenyl
(CBP)

tris(2-phenylpyridine)iridium
(Ir(ppy)$_3$)

tris-(8-hydroxy-quinoline)aluminum
(ALQ)

FIG.6A VIBRATOR TYPE — Prior Art

FIG.6B TRANSPARENCY TYPE — Prior Art

4,4'-N,N'-dicarbozole-biphenyl
(CBP)

2,3,7,8,12,13,17,18-octaethyl
-21H,23H-porphine platinum
(PtOEP)

4,4'-bis(N-(1-naphthyl)-N-phenyl-amino)biphenyl
(α-NPD)

tris-(8-hydroxy-quinoline)aluminum
(ALQ)

HIGH-EFFICIENCY ORGANIC LIGHT EMITTING ELEMENT

INCORPORATION BY REFERENCE

The present application claims priority from Japanese applications JP 2003-303051 filed on Aug. 27, 2003, and JP 2004-094009 filed on Mar. 29, 2004, the contents of which are hereby incorporated by reference into this application.

BACKGROUND OF THE INVENTION

This invention relates to a structure realizing a high-efficiency light emission, in a thin-film light emitting display panel. This invention is utilized in light sources, information display panels, etc.

"Interference" (resonance) is a phenomenon of vibration obtainable as a result of superposition of a plurality of vibrations having an interfering character; and the term "vibrator" means an apparatus or a mechanism creating an interference (vibration).

By providing a semi-transparent reflecting mirror in the front of the light emitting plane of an organic light emitting element and making a vibrator (micro-vibrator) in which the optical length (the sum of forward and backward optical lengths) is equal to an integral times as long as the desired light-emitting wavelength, it is possible to make the light-emitting spectrum monochromatic and, at the same time, enhance the light emission peak strength (cf. "Organic Electric Field Light Emitting Element and Substrate Thereof" mentioned in JP-A-H08-213174).

Figure 6A:
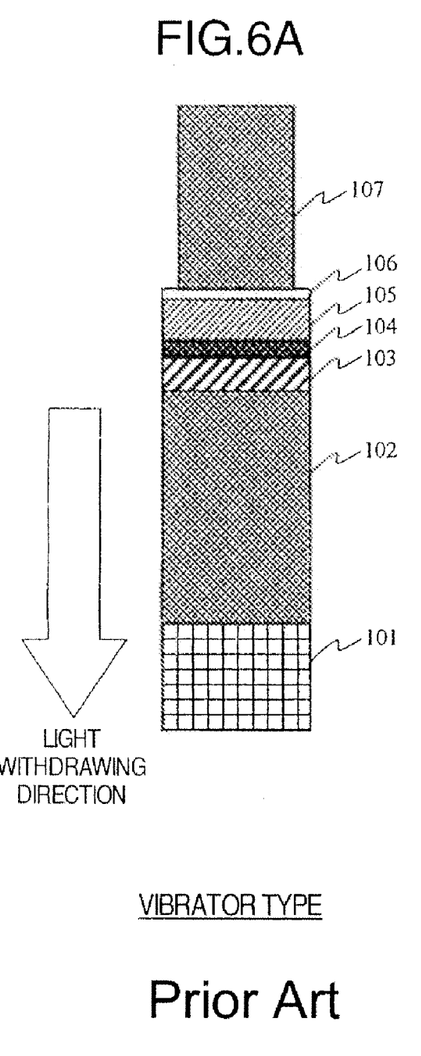
FIG. 6A is a structural diagram illustrating an organic light emitting element having a structure of vibrator type.

FIG. 6A illustrates one example of the element structure thereof; wherein 101 is a semi-transparent reflecting film, 102 is a transparent electrically conductive film, 103 is a hole transporting layer, 104 is a light emitting layer, 105 is an electron transporting layer, 106 is an electron injecting layer such as an alkali metal compound or the like, and 107 is an anode made of aluminum or the like. The physical properties relating to the structure of vibrator are mentioned in detail in a document, T. Nakayama: "Organic luminescent devices with a microcavity structure", included in "Organic electroluminescent materials and devices", edited by S. Miyata, published by Gorden & Breach Science Publisher (1997).

Figure 6B:
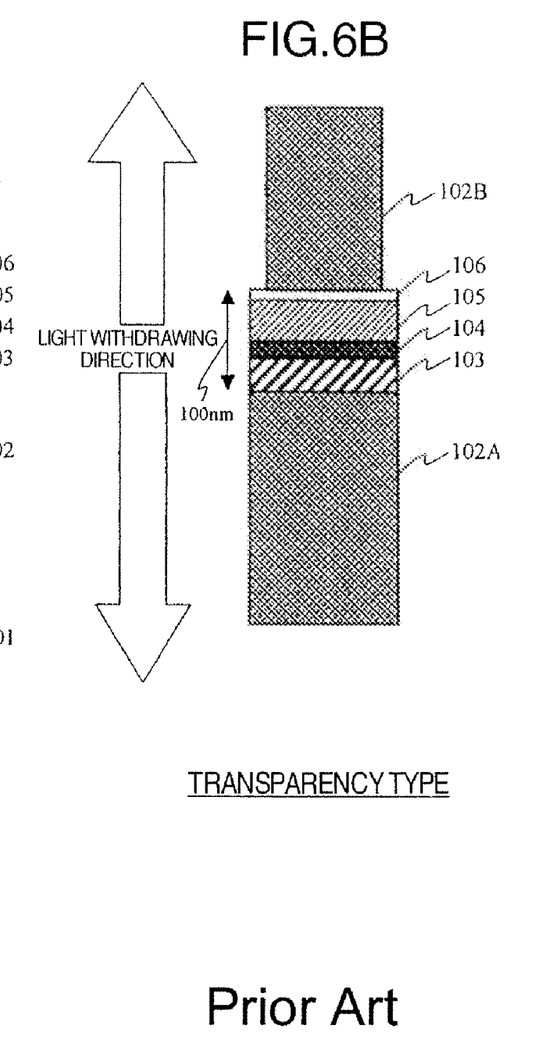
FIG. 6B is a structural diagram illustrating an organic light emitting element of transparent type.

For the purpose of realizing a "transparent light emitting panel", a transparent element structure using a transparent electrode in place of an opaque metallic electrode has been proposed in JP-A-2002-231054, etc. FIG. 6B illustrates one example of the element structure, wherein 102A and 102B are transparent electrically conductive films, 103 is a hole transporting film, 104 is a light emitting layer, 105 is an electron transporting layer and 106 is an electron injecting layer such as an alkali metal compound or the like.

In a vibrator structure element for use in high-luminescence light emission, it is important to design optimum electric and magnetic field distributions in the direction of film thickness in the element, in order to realize a high luminance and a high efficiency (cf. Spring Meeting of the Japanese Society of Applied Physics, a-PB-11; etc.). However, since prior vibrator structure elements have hardly had a degree of freedom with regard to adjustment of film thickness of electron transporting layer because of the charge balance control of element, it is hardly possible to control the phase of electromagnetic wave emitted from the light emitting layer, reflected on the metallic electrode and again returned to the light emitting layer. As for the transparent element structure, optimum design of electromagnetic field distribution has not been performed, because a transparent element originally has no structure of returning the emitted light to inside of element and causing vibration.

In the electric field light emission utilizing the π electron light emission, the molecules used for light emission can be classified into two groups according to the excited state which the molecules use mainly for light emission. The first group consists of molecules utilizing the singlet excited state which are characterized in that (1) the internal quantum yield does not exceed 25% and (2) relaxation time of excited state (the characteristic time required for lowering the light emission strength by 1/e) is short (not longer than 100 ns).

The second group consists of molecules utilizing the triplet excited state, too, for the light emission. This group is characterized in that (1) the internal quantum yield exceeds 25%, (2) relaxation time of excited state is long (1 μs or more), and (3) the molecules are combined with (coordinated to) a heavy metal causing an orbital-spin interchanging interaction such as iridium, platinum and the like.

Some materials of the second group of which lifetime of relaxation of the excited state is so long as at least several μ seconds are transferred and diffused from the light emitting layer until the excited state is relaxed. Accordingly, when such a light emitting material is used, there arises a problem that, so far as an element of prior vibrator structure is used, the excited state having reached the metallic electrode is inactivated without light emission, so that high luminance and high efficiency cannot be realized.

The principle of light emission from an organic electric field light emitting element is as follows. Thus, an electric field is applied between one pair of electrode films to inject electrons and positive holes into the light emitting layers, recombining the electrons and the holes in the light emitting layer to form excitons, and light is emitted from the light-emitting molecules in the light emitting layer by the use of the excitons. As has been mentioned above, the light emitting layer used in the organic electric field light emitting element is formed from a plurality of organic thin films and the film thickness thereof is at most about several tens nm. Thus, herein is a problem that when lifetime of the exciton formed is long and the exciton is transferred over a long distance until it is diminished and it has reached the metallic electrode film, the exciton is diminished without taking part in the light emission and thereby reduces light emission efficiency of the element. In order to solve this problem, an electrode material not causing the disappearance of exciton before participation in light emission should be used, or the metallic electrode film should be sufficiently kept away from the region in which the exciton moves around.

SUMMARY OF THE INVENTION

The problem of non-light emission inactivation can be solved by using a transparent electrically conductive film as both the anode and cathode, providing a film having a light reflecting function on outsides of both of the anode and cathode, and making the space between them function as a light vibrator.

That is to say, a stationary wave can be formed in the film due to the interference between the traveling and reflected waves, by adjusting the length of vibrator (a sum of the distance between the upper and lower reflecting mirrors and a length corresponding to phase shift due to reflection) to a value integral times as long as the desired light emission wavelength.

By adjusting film thickness of the transparent electrode so that the light emitting part of the light emitting layer comes to the loop position of the stationary wave, the efficiency in the high-luminance region can be improved. Further, since this structure uses no metallic film as an electrode, the inactivation without light emission of the excited state having reached the metallic electrode which has conventionally taken place in the prior vibrator structures can be eliminated.

Other objects, features and advantages of the invention will become apparent from the following description of the embodiments of the invention taken in conjunction with the accompanying drawings.

BRIEF DESCRIPTION OF THE DRAWINGS

FIGS. 1A and 1B illustrate a fundamental structural diagram of an organic light emitting element according to this invention, wherein

FIGS. 2A and 2B show a structural diagram illustrating an organic light emitting element according to Example 1 of this invention, wherein

FIGS. 3A, 3B, 3C, 3D, 3E and 3F illustrate a structural diagram of an organic light emitting element using a metallic reflection-screening film according to Example 2 of this invention, wherein

FIGS. 4A, 4B, 4C and 4D illustrate a structural diagram of an organic light emitting element using a metallic non-reflection-screening film according to Example 3 of this invention, wherein

FIGS. 6A and 6B illustrate a structural diagram illustrating prior organic light emitting element, wherein

DETAILED DESCRIPTION OF THE INVENTION

Figure 1A:
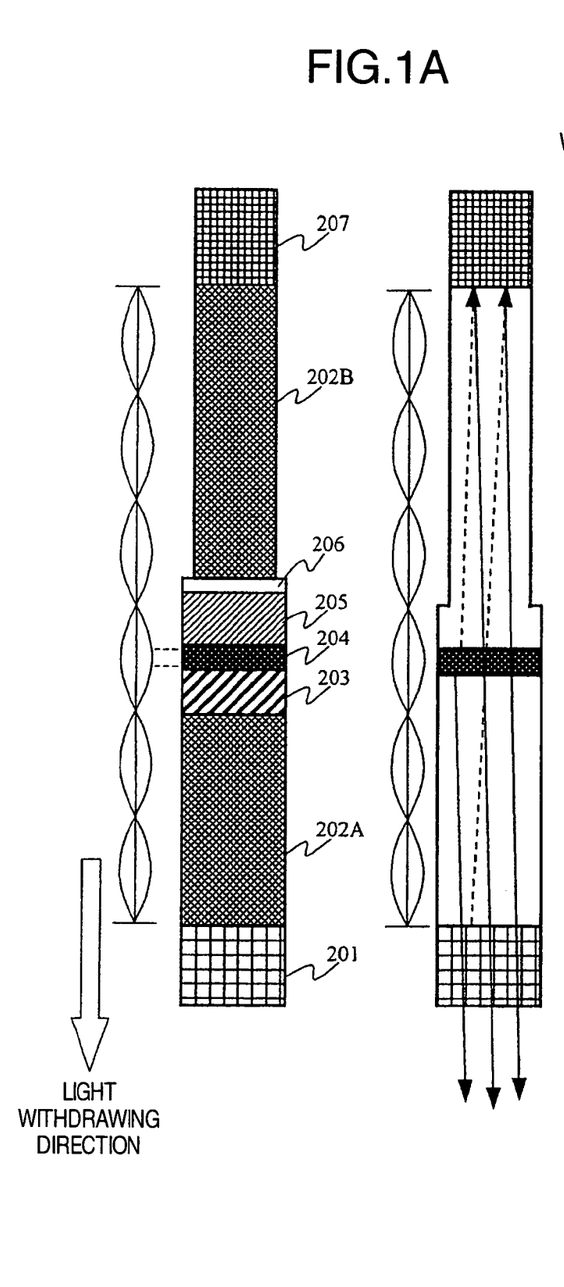
FIG. 1A is a fundamental structural diagram of an organic light element having a structure of cathode-side withdrawing type.
Figure 1B:
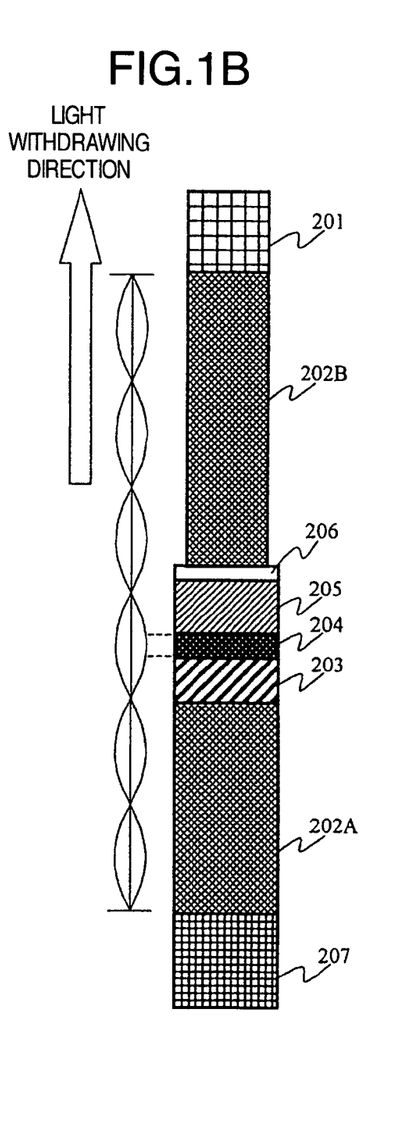
FIG. 1B is a fundamental structural diagram of an organic light emitting element having a structure of anode-side withdrawing type.

FIGS. 1 illustrate a fundamental structure of this invention. In FIG. 1A, 201 is a semi-transparent reflecting film, 202A and 202B are transparent electrically conductive films, 203 is a hole, 204 is a light emitting layer, 205 is an electron transporting layer, 206 is an electron injecting layer, and 207 is a high reflection-transmission screening film.

203 to 206 are semi-conductor thin film parts of the light emitting element. Regarding the layer construction thereof, modifications are possible by a combined use or role separation of the charge transporting functions, in the same manner as in usual organic LED.

For realizing a semi-transparent reflecting structure 201, an interfacial reflection by lamination of transparent materials different in refractive index may be employed. Further, by constructing a plurality of interfaces and by making the sum of twice the optical distance between the interfaces and the phase shift by the reflection comes to integral times the desired wavelength of reflection, the reflection can be superposed. Needless to say, the interface outside the transparent electrically conductive films are also utilizable for this reflection.

Since the high reflection-transmission screening film 207 is constructed so that the element itself is transparent as in the elements of hitherto known cases shown in FIG. 6B, transmission of the outer light of the other side is prevented, and light emitted from one element can be integrated into one direction and taken out.

If strength of the transmitting outer light is comparable to that of the light generated in the element, a problem arises in the point of recognizability as a display. Although this problem may be dependent on the environment of use and the purpose of use, it is considered desirable to lower it to about 1/10 when the outer light has a strength of 50 cd/m$^2$.

For forming a high reflection-transmission screening film 207, a number of films different in refractive index are laminated to superpose the reflection, or the film is combined with a film carrying out a metallic reflection. As a method for stably laminating an oxide film or the like with a metallic film maintaining a metallic reflection, there can be referred to a method of forming a silicon nitride on the metallic reflection surface, or a method of using a metallic film not losing the metallic gloss even if laminated with ceramics, such as chromium, tungsten, titanium, gold, etc.

Further, by adopting a low-temperature process suppressing the progress of interfacial reaction, aluminum becomes usable in some cases. Further, since these metallic films are not required to have an electrical conductivity as an electrode, preparing a metallic thin film on a substrate different from the substrate for organic light emitting element and placing the metallic thin film closely to the element is also an effective method. Another method which can also be referred to is to provide a film having an outer light-screening function on the outside of the film structure having a reflection function.

As the hole-injecting layer 206, an alkali metal compound having a small work function, such as LiF and the like, is formed into a thickness giving no continuous film (for example, about 1 nm) and put to use.

In the right-hand explanatory drawing of FIG. 1A, the arrows indicate the lights going forward and backward on the element while being reflected on the reflecting planes. Interference or vibration takes place by superposition of these lights.

FIG. 1B indicates an element in which the direction of withdrawing the emitted light is opposite to that in FIG. 1A, or the direction of cathode. The positions of semi-transparent reflecting structure 201 and the high reflection-transmission screening film 207 are opposite to those in FIG. 1A.

In both FIGS. 1A and 1B, the substrate functioning as the base of element may be in any side of the laminated structure of the figure. Needless to say, a sufficient transparency for the usage is required of the substrate, when the substrate is placed in the light-withdrawing side.

As the material constituting the light emitting layer, a material giving a great superposition of light emission spectrum and excitation spectrum is desirable. As the intrinsic vibration number (wavelength) of the vibrator, a value giving a greater degree of superposition is more effective.

The principle and structural conditions of the organic light emitting element having a vibrator structure and the transmission characteristics of the laminated transparent film are mentioned in detail in the above-mentioned non-patent literature 1. Optical length of the vibrator can be evaluated from comparison with samples varied in angle-dependency and film thickness.

Another means for this invention is an organic light emitting element characterized by successively laminating a metallic reflecting film, a thin film of a fluorinated metal, a first transparent electrically conductive film, a light emitting layer and a second transparent electrically conductive film.

Herein, the term "thin film of a fluorinated metal" is a thin film consisting of a fluorinated metallic compound, which is a thin film not readily participating in a chemical reaction with any of the metallic reflecting film and the transparent electrically conductive film. As examples thereof, lithium fluoride (LiF), cerium fluoride (CeF) and the like can be referred to.

The term "transparent electrically conductive film" means a film having a transparency in the wavelength region of the light emitted by the light emitting layer and, at the same time, having an electrical conductivity. Examples thereof include ITO (indium tin oxide), IZO (indium zinc oxide) and the like.

In the above-mentioned successively laminated layer structure, it is also possible to make "other layers" intervene, if necessary. In other words, it is not always necessary that the layers constituting the structure are contacted with each other. As an example of said "other layers", the buffer layer provided between the transparent electrode and the light emitting layer can be referred to.

As yet another means, there can be referred to a displaying apparatus using an organic electric filed light emitting element characterized by using an organic light emitting element in which a substrate, a metallic reflecting film, a thin film of a fluorinated metal, a first transparent electrically conductive film, a light emitting layer and a second transparent electrically conductive film are successively laminated.

As a third means, there can be referred to a displaying apparatus using an organic electric field light emitting element characterized by using an organic light emitting element in which a metallic reflecting film, a thin film of a fluorinated metal, a first transparent electrically conductive film, a light emitting layer, a second transparent electrically conductive film and a substrate are successively laminated.

As a fourth means, there can be referred to a substrate having a laminated structure of a transparent electrically conductive film, a thin film of a fluorinated metal and a metallic film.

According to this invention, the length of vibrator (the sum of the distance between the upper and lower reflecting mirrors and a length corresponding to the phase shift due to reflection) is made integral times the desired wavelength of light emission, and thereby a stationary wave can be formed in the film by interaction between traveling and reflected waves.

By controlling the film thickness of the transparent electrode so that the light emitting part of the light emitting layer comes to the loop position of the wavelength of this stationary wave, the efficiency in the high luminescence region can be improved.

Further, since this structure does not use a metallic film as the electrode, the problem of non-light emitting inactivation of excited state reached on the metallic electrode which has taken place in the prior vibrator structures can be eliminated.

Further, this invention can provide a light emitting element of high efficiency and a displaying apparatus using the same.

DESCRIPTION OF PREFERRED EMBODIMENT

Hereunder, examples of this invention will be explained in detail.

EXAMPLE 1

Figure 2A:
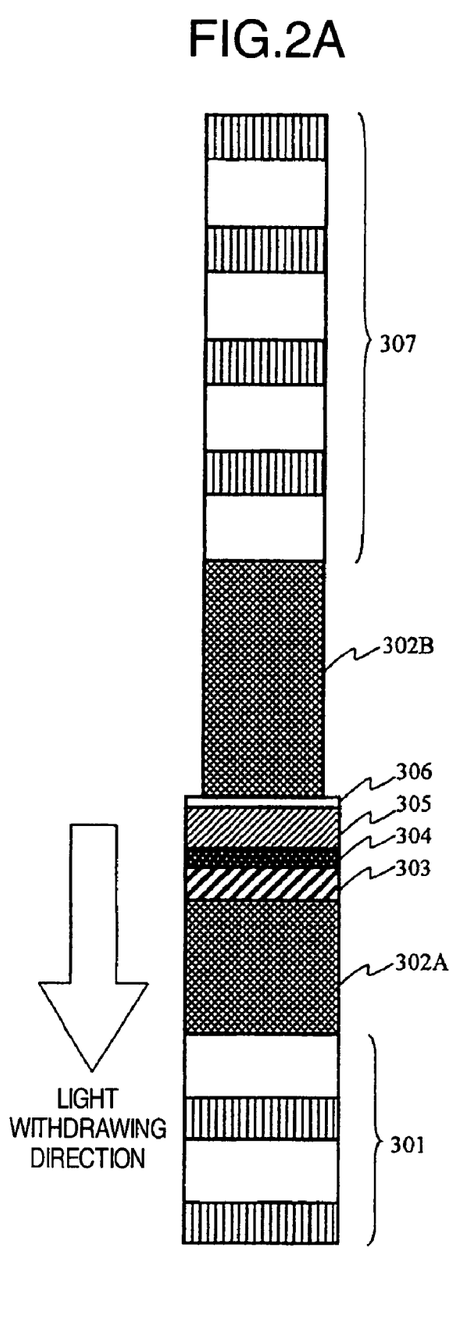
FIG. 2A is a structural diagram of an organic light emitting element having a structure of cathode-side withdrawing type.

FIG. 2 illustrates Example 1 of this invention. In FIG. 2A, as a semi-transparent reflecting layer 301, 4-laminated dielectric material films (titanium oxide $TiO_2$ (56 nm in thickness)/silicon oxide $SiO_2$ (89 nm in thickness)/$TiO_2$ (56 nm in thickness)/$SiO_2$ (89 nm in thickness), from the outside to the inside, is used. In this structure, the three intermediate interfaces and the interface between the outer atmosphere and $TiO_2$, and the interface between $SiO_2$ and transparent electrode 302A, five planes in the total, function as a reflecting plane.

Figure 5:
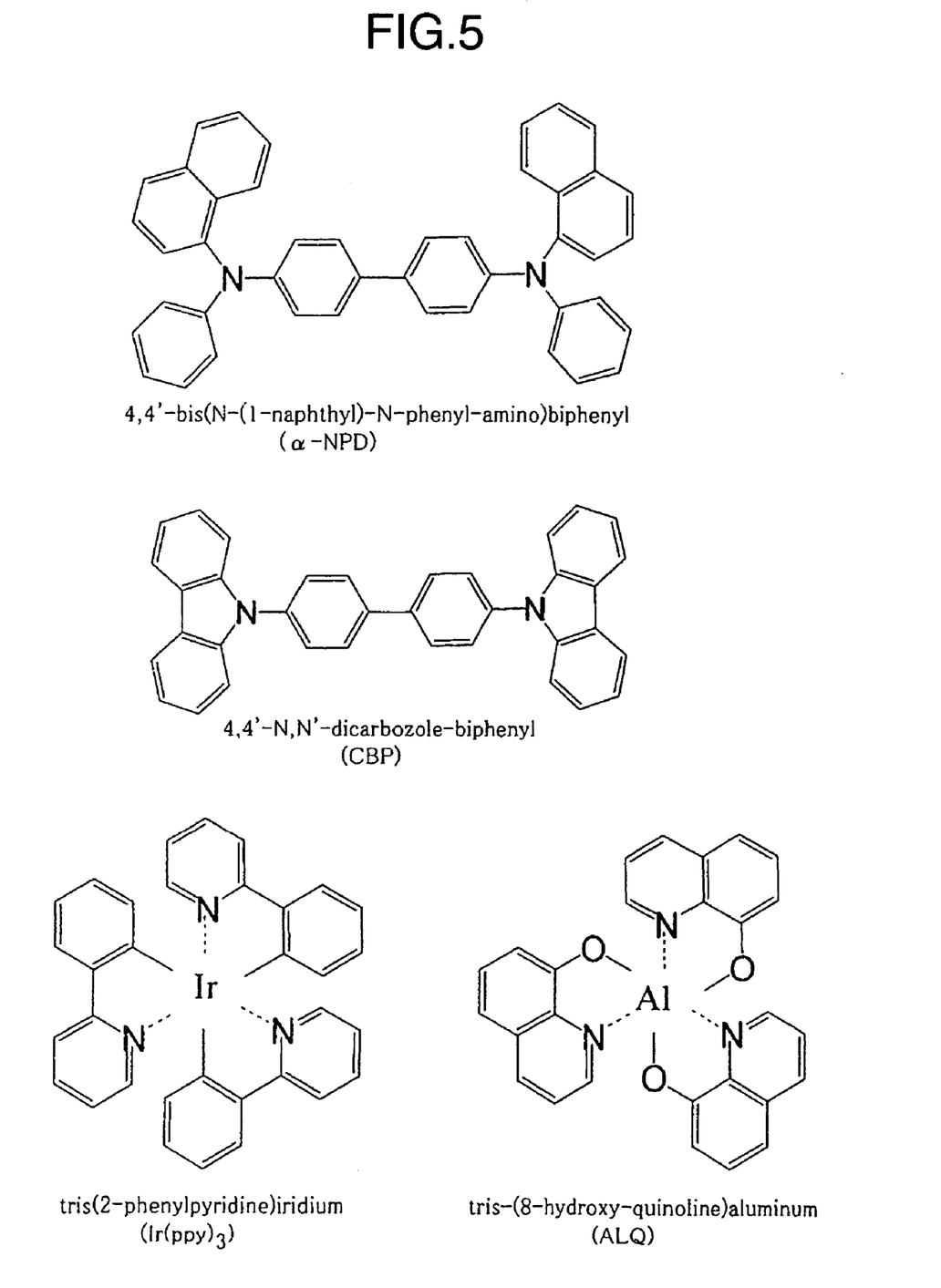
FIG. 5 is a structural diagram illustrating organic material molecules.

As a transparent electrode 302A, ITO (indium tin oxide) is formed up to a thickness of 175 nm. As a hole-injecting layer 303, alpha-NPD is formed up to a thickness of 40 nm. As a light emitting layer 304, a film of CBP into which $Ir(ppy)_3$ has been mixed in an amount of 6% by volume is formed up to a thickness of 20 nm. As an electron-transporting layer 305, ALQ is formed up to a thickness of 50 nm. (Structures of the organic molecules are shown in FIG. 5). As an electron-injecting layer 306, LiF is formed up to a thickness of 1.0 nm. As a transparent electrode 302B, ITO (indium tin oxide) is formed up to a thickness of 315 nm.

As a high reflectance layer 307, an eight-laminated film consisting of the following eight dielectric material layers: as referred to from the side of light emitting layer, $SiO_2$ (89 nm in thickness)/$TiO_2$ (56 nm in thickness)/$SiO_2$ (89 nm in thickness)/$TiO_2$ (56 nm in thickness)/$SiO_2$ (89 nm in thickness)/$TiO_2$ (56 nm in thickness)/$SiO_2$ (89 nm in thickness)/$TiO_2$ (56 nm in thickness) is used.

In this example, a semi-transparent reflecting layer 301 and a high reflection layer 307 are obtained by varying the total number of laminated reflected films or the number of superposed reflecting planes and thereby enlarging the reflectance and making small the transmittance. However, it is also possible to vary the wavelength characteristics of reflectance by changing the film thickness of lamination.

Figure 2B:
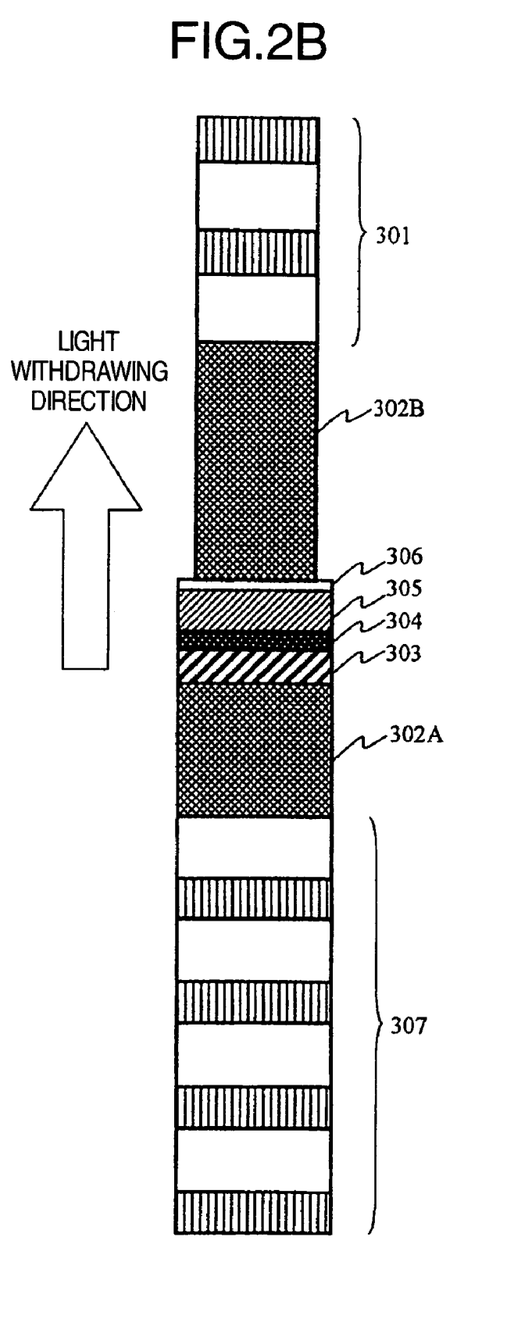
FIG. 2B is a structural diagram of an organic light emitting element having a structure of anode-side withdrawing type.

In FIG. 2B, the direction of withdrawing the emitted light is opposite to that in FIG. 2A, namely in the direction of cathode, and the positions of semi-transparent reflecting structure 301 and high reflection-transmission screening film 307 are inverse to each other. In both of them, the substrate forming the element may be in any side of the laminated structure. As the substrate, a glass substrate, a quartz substrate, a transparent resin substrate and the like can be used. When the substrate is placed in the opposite side of the direction of withdrawing the light, it is unnecessary to use a transparent substrate, but an opaque substrate or a substrate obtained by forming an opaque structure on a transparent substrate can also be used.

EXAMPLE 2

Figures 3A, 3B, 3C:
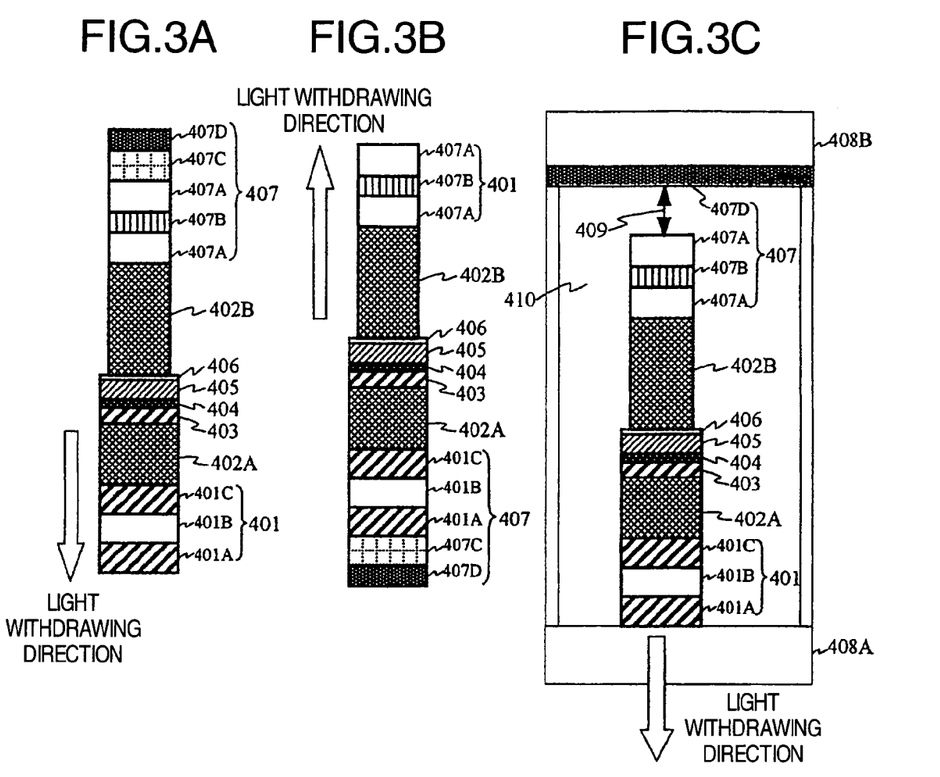
FIG. 3A is a structural diagram of an organic light emitting element having a structure of cathode-side withdrawing type.
FIG. 3B is a structural diagram of an organic light emitting element having a structure of anode-side withdrawing type.
FIGS. 3C-3F are structural diagrams of organic light emitting elements of various structures.

FIG. 3 illustrates Example 2 of this invention. In FIGS. 3A and 3B, thin films of silicon nitride or chromium (407C, 407D) are laminated as reflecting films on the outside of multilayered semitransparent reflecting films (407A, 407B, 407A or 401A, 401B, 401C). The emission from one side of transparent electrode is suppressed and this side is enclosed to enhance the efficiency and used as a screening side, and light is taken out only from another transparent electrode side.

In FIG. 3A, from the outside successively, three-layered laminated films 401A, 401B and 401C ($Si_3N_4/SiO_2/Si_3N_4$) are used as semitransparent reflecting layers 401. As this film, a thin film formed at the time of formation of thin layer transistors formed on one substrate for driving organic LED display element, and the like, can be used. Desirable characteristics can be obtained by adjusting the process so that the film thickness becomes approximately ¼, ¾, - - - , (2n+1)/4 times as long as the desired wavelength.

As the transparent electrode 402A, ITO (indium tin oxide) is formed into a thickness of 175 nm. As a hole injecting layer 403, alpha-NPD is formed into a thickness of 40 nm. As a light emitting layer 404, a film consisting of CBP containing 6% by volume of $Ir(ppy)_3$ is formed into a thickness of 20 nm. As an electron transporting layer 405, ALQ is formed into a thickness of 50 nm. As an electron injecting layer 406, LiF (1.0 nm) is formed. As a transparent electrode 402B, ITO (indium tin oxide) is formed into a thickness of 315 nm.

As reflecting layers 407A and 407B, three-layered laminated films 407A, 407B, 407A of $SiO_2$ (89 nm in thickness)/$TiO_2$ (56 nm in thickness)/$SiO_2$ (89 nm in thickness) are provided, from the light-emitting side successively.

As metallic reflecting plane structures 407C, 407D, thin films of silicon nitride and chromium are laminated. The emission from the transparent electrode 402B side is suppressed and the efficiency of enclosing is enhanced, and this side is used as the screening side, and the light is taken out only from the side of the other transparent electrode 402A.

Silicon nitride 407C is used as a reflecting plane protecting layer (metallic reflection gloss retaining low reactivity film), and this layer may be formed from other films, if desired, so far as the material has the same function as above. The chromium is used as a metal which readily maintains a metallic reflecting plane, and the chromium may be replaced with other metal such as gold or metallic gloss substance so far as the reflection can sufficiently be maintained. In cases where the required reflection characteristics can be obtained by using chromium, tungsten, titanium or the like and employing a low temperature forming process and forming the film directly on the transparent electrically conductive film, the silicon nitride 407C may be omitted.

In FIG. 3B, the emission from the transparen6t electrode 402A side is suppressed and the enclosing efficiency is enhanced, and this side is used as the screening side, and the light is taken out only from the side of the other transparent electrode 402B. Metallic reflecting plane structures 407C, 407D are provided on the outside of the laminated film 401A of semitransparent reflecting layer 401.

In FIG. 3C, the metallic reflecting plane structure 407D of FIG. 3A is formed on substrate 408B different from the light emitting element, and laminated on substrate 408A of the light emitting element. Since in this structure the adverse influence that the metallic film 407D reacts with the underlying oxide film or the like to lower the metallic reflection function can be avoided, the metallic reflecting plane structure 407C can be omitted owing to the gap distance 409. The closed space 410 between the substrate may be evacuated or an appropriate gas may be sealed thereinto. The space distance 409 is taken so as to superpose with the interfacial reflections of 407A, 407B, 407A, etc. in one method, or it may be made to be sufficiently large as compared with the emitted wavelength so make the interfered period sufficiently small on the other method.

Figures 3D, 3E, 3F:
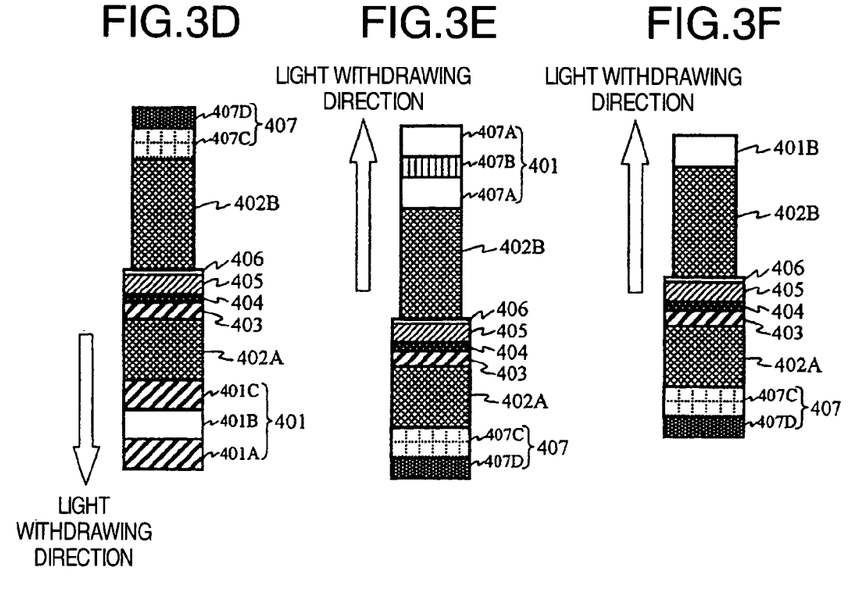

FIG. 3D denotes an element in which the high reflection-transmission screening film 407 is made only from metali8c-reflecting plane structures 407C and 407D, and the reflecting layers 407A, 407B, 407A are omitted. In the structure of FIG. 3d, it is feared that the light emitting layer 404 and metallic thin film 407D are close to each other as compared with the structure of FIG. 3A, so that the probability of non-light emitting disappearance of exciton may increase. Nevertheless, as compared with the structure of FIG. 6A of known example, the gasp between them is three times or more, showing a great improvement.

FIG. 3E is an element of FIG. 3B, except that the high reflection transmission screening film 407 is made only from metallic reflecting plane structures 407C, 407D to omit the semi-transparent reflecting layers 401A, 401B, 401C.

The element of FIG. 3F is the same as that of FIG. 3E, except that the semitransparent reflecting layer 401 is simplified. When it is intended to obtain as high a effect with such a simplified structure, the difference between refractive indices of semi-transparent reflecting layer 401B and 402B plays an important role. When titanium oxide is used as the semi-transparent reflecting layer 401B, it is advisable to use a film having as small a refractive index as possible as the transparent electrode 402B. Inversely, when silicon oxide is used as the 401B, refractive index of transparent electrode 402B is usually greater than it, so that the use of a film having as large a refractive index as possible is advisable.

EXAMPLE 3

Figures 4A, 4B:
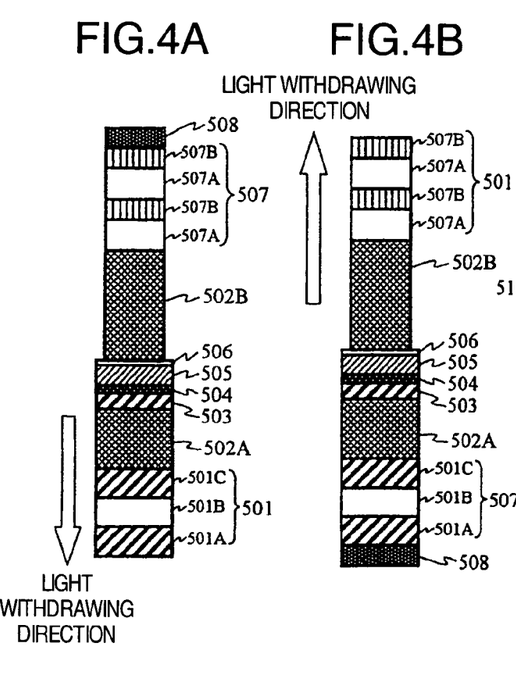
FIG. 4A is a structural diagram of an organic light emitting element having a structure of cathode-side withdrawing type.
FIG. 4B is a structural diagram of an organic light emitting element having a structure of anode-side withdrawing type.

FIG. 4 illustrates Example 3 of this invention. FIG. 4A is a structure using a film 508 having no reflecting function in place of the metallic reflecting plane structures 407C, 407D of FIG. 3. The reflecting structure exhibiting a vibrator function is the laminated reflecting film 507, and the film having no reflecting function 508 plays only a role of screening film which prevents the passing of the light coming from outside of the element into the direction of light withdrawal.

In FIG. 4A, a 3-layered laminated film $Si_3N_4/SiO_2/Si_3N_4$, from the outside successively, is used as the semitransparent reflecting layers 501A, 501B, 501C. It is allowable to use, as this film, the thin film formed at the time of preparing a thin film transistor formed on one substrate for the purpose of driving organic LED display image element, and the like. God characteristic properties can be obtained by controlling the film thickness so as to become close to $\frac{1}{4}$, $\frac{3}{4}$, - - - , $(2n+1)/4$, times as large as the desired wavelength.

As a transparent electrode 502A, ITO is formed into a thickness of 175 nm. As a hole injecting layer 503, alpha-NPD is formed into 50 nm. As a light emitting layer 504, a film consisting of CBP into which is mixed 6% by volume of $Ir(ppy)_3$ is formed into a thickness of 20 nm. As an electron transporting layer 505, ALQ is formed into a thickness of 50 nm. As an electron injecting layer 506, LiF (1.0 nm) is formed. As a transparent electrode 502B, ITO is formed into 315 nm.

As reflecting layers 507A, 507B, a four-layered laminated film of $SiO_2$(89 nm in thickness)/$TiO_2$(56 nm in thickness)/$SiO_2$(89 nm in thickness)/$TiO_2$(56 nm in thickness), successively from the side of light emitting layer, is used.

As a screening layer 508, a thin film of aluminum (1.5 μm) is formed. Due to the reaction caused by the heat and natural diffusion at the time of vapor deposition, the metallic reflection is lost at the interface between screening layer 508 and reflecting layer 507, and therefore the function of screening film 508 is mainly the role as a screening film for preventing the light coming from outside of the element passes into the direction of withdrawing the light.

As the screening film 508, any films may be used so far as the films have a structure screening the passage of outer light. That is a film having a function of diffusing the reflected light into random directions, a function causing a deflection of reflected light, a function of black colored film, a function of reflected color modifying filter function, etc. or a film having a function of supporting the characteristic properties of organic LED element, can be used.

FIG. 4B is a structure in which screening layer 508 is provided in the opposite side to FIG. 4A. The direction of taking out the light is the cathode side, inversely.

Figure 4C:
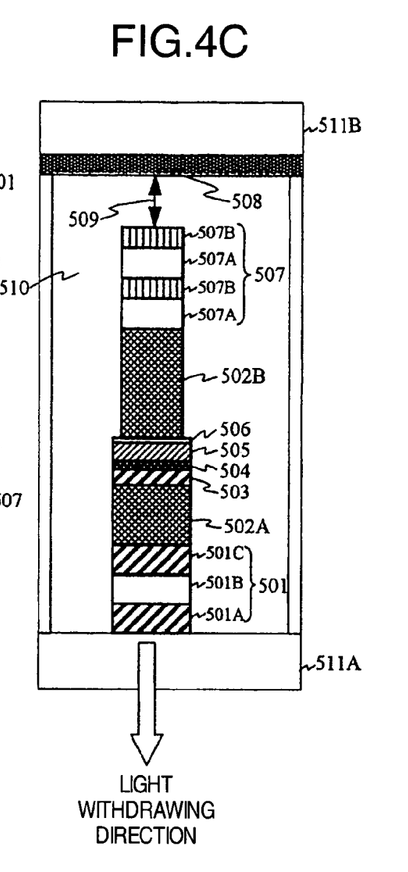
FIGS. 4C-4D are structural diagrams of organic light emitting elements of various structures.

FIG. 4C is a structure in which the screening film structure 508 of FIG. 4A is formed on another substrate 511B different from that of light emitting element and laminated on the substrate 511A of the light emitting element. Since in this case the reflection from the screening film structure 508 is not utilized for vibration, the gap distance 509 may take any arbitrary value. The closed space 510 between the substrates may be evacuated or filled with an appropriate gas.

Figure 4D:
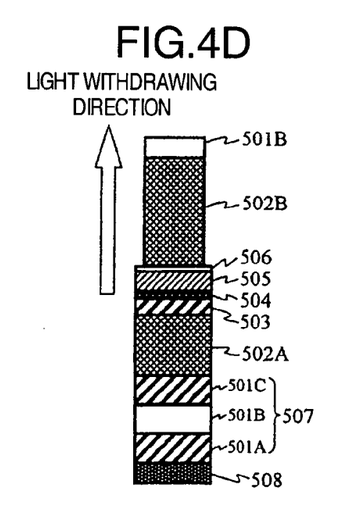

FIG. 4D represents an element in which semitransparent reflecting layer 501 of FIG. 4B is simplified. When it is desired to obtain an improved effect, if any, with such a simplified structure, the difference in refractive index between semitransparent reflecting layer 501B and transparent electrode 502B plays an important role. In case of using titanium oxide as the semitransparent reflecting layer 501B, it is advisable to use a film having as small a refractive index as possible as the transparent electrode 502B. Inversely, in a case of using silicon oxide as the semitransparent reflecting layer 501B, it is advisable to use a film having as high a refractive index as possible, because refractive index of transparent electrode 502B is usually higher than it.

EXAMPLE 4

Figure 7:
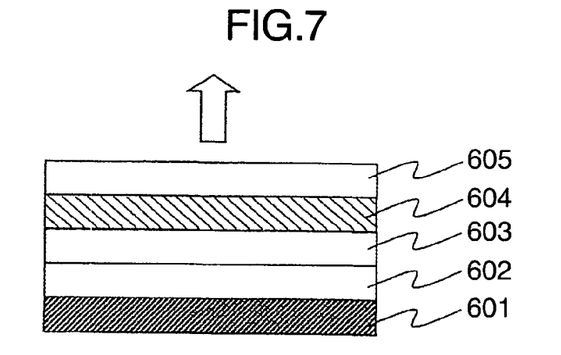
FIG. 7 is a sectional view illustrating an organic electric field light emitting element according to Example 4.

FIG. 7 is a drawing illustrating an organic electric field light emitting element of the present example. The element of FIG. 7 is constructed by successively laminating a metallic reflecting film 601, a thin film of fluorinated metal 602, a first transparent electrically conductive film 603, a light emitting layer 604 and a second transparent electrically conductive film 605. According to this element, the distance between the light emitting layer recombining electron and hole and the metallic electrode can be made large by providing transparent electrically conductive films on both sides of light emitting layer 604 and, at the same time, since it is unnecessary to use a metal as the electrode, the problem that the exciton disappears without contributing to light emission and thereby the light emission efficiency of the element is lowered can be solved, and there can be obtained an organic electric field light emitting element having a high efficiency of light emission. In FIG. 7, the arrow indicates a rough direction of the emitted light taken out from the element (this is the same, in the other drawings, too).

Further, in the element shown herein, a thin film of a fluorinated metal is provided between the first transparent electrically conductive film 603 and the metallic reflecting film 601. This is for the purpose of preventing the disadvantage that, if the transparent electrically conductive film and the metallic film are directly contacted with each other, the both take part in a chemical reaction, as a result of which a state of oxygen deficiency appears in the metal oxide film or transparent electrically conductive film and, as its result, a decrease in reflectance occurs. The thin film of fluorinated film 602 is chemically more stable than any of the metallic film and the transparent electrically conductive film and does not readily take part in a chemical reaction and, in addition, 602 is generally transparent in the region of the light emitted by the light emitting layer. Further, the existence of the thin film of fluorinated metal enables to keep the distance between the light emitting layer and the metallic reflecting film surely. Thus, owing to the properties mentioned above, the state just after formation of organic electric field light emitting element can be roughly maintained, the reflecting characteristics of metallic film and the transparency and electrical conductivity of the transparent electrically conductive film can be maintained over a long period of time, and an organic electric field light emitting element carrying out a light emission of high efficiency can be realized.

EXAMPLE 5

Figure 8:
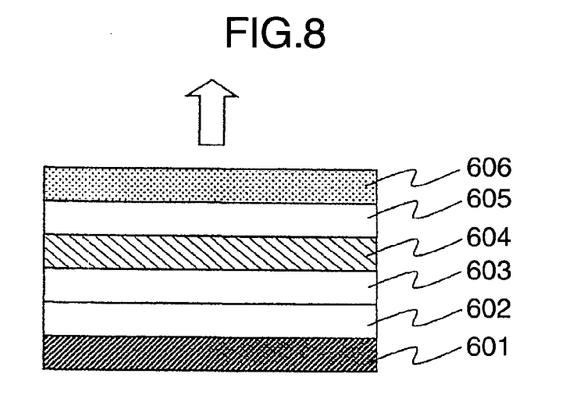
FIG. 8 is a sectional view illustrating an organic electric field light emitting element according to Example 5.

FIG. 8 is a drawing illustrating an organic electric field light emitting element according to this embodiment. In addition to the structure of the organic electric field light emitting element of Embodiment 1 mentioned above, the organic electric field light emitting element of FIG. 8 further has a semi-transparent reflecting layer 606 formed on the other side of the light emitting layer of the second transparent electrically conductive film 605, and the distance between this semi-transparent reflecting layer 606 and the metallic reflecting film 601 is controlled so that it becomes integral times as large as the half-wavelength of the peak of the light emitted from the light emitting layer, so that the element can function as a vibrator. The element of this embodiment has the effect of the element mentioned in Example 4 and, in addition, the organic light emitting element is made to retain the function of a vibrator, so that a light having a narrower half-value width and a stronger peak strength can be obtained from the light emitted from the light emitting layer which has a broad half-value width. Further, the element according to this embodiment has another merit that it has two transparent electrically conductive films between the semi-transparent reflecting layer 606 and the metallic reflecting film 601 so that the optical distance necessary for acting as a vibrator is more easily controllable. The semi-transparent reflecting layer 606 is a layer having a function of transmitting a part of the light coming from the light emitting layer and reflecting a part thereof, and structure thereof is not particularly limited so far as it has the above-mentioned function. As a preferable example of this layer, there can be referred to a layer consisting of a multi-layered dielectric material film formed by laminating a plurality of dielectric material films different in refractive index.

The difference of the present embodiment from Example 4 can appropriately be applied to other embodiments, and the present embodiment by no means exhibits the effect thereof only when subordinate to Example 4.

EXAMPLE 6

Figure 9:
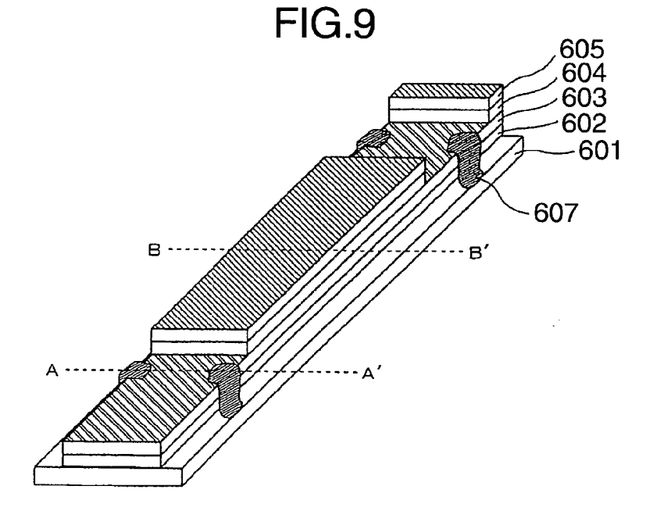
FIG. 9 is an oblique view illustrating an organic electric field light emitting element according to Example 6.
Figure 10A:
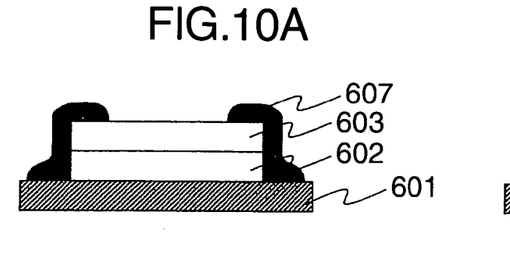
FIG. 10 is a sectional view illustrating an organic electric field light emitting element according to Example 6.
Figure 10B:
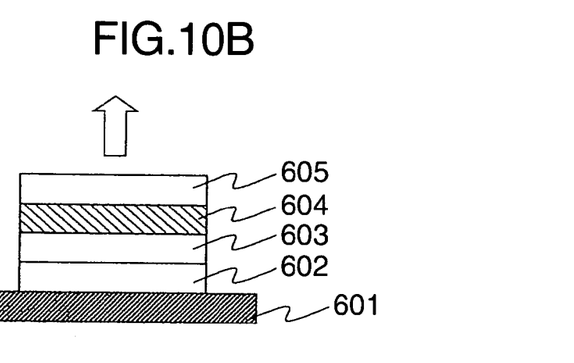

The organic electric field light emitting element of Example 4 has a thin film of fluorinated metal between the first transparent electrically conductive film 603 and the metallic reflecting film 601. Since this film has an insulating character, the current for driving the element passes only through the first transparent electrically conductive film 603, so far as the element is used as it is. However, the transparent electrically conductive film has a high resistance to metals, and a lower resistance is desirable from the viewpoint of efficiency of light emission. Accordingly, in the present embodiment, the first transparent electrically conductive film and the metallic reflecting film are electrically connected by means of a metallic part 607. FIG. 9 is an oblique view of the organic electric field light emitting element according to the present embodiment, and FIGS. 10(a) and (b) are partial sectional views of a plane including any one of A-A' and B-B' in FIG. 9 and parallel to the direction of lamination of the film. Although the organic electric field light emitting element of this embodiment is roughly the same in the construction of lamination as Example 4, the metallic reflecting film 601 has a broader area than the thin film of fluorinated metal 602 and the first transparent electrically conductive film 603 for the sake of enabling connection. Further, in a part of this laminated structure, there is provided a region from which light emitting layer 604 and second transparent electrically conductive film 605 have been removed, and in this region a metallic part 607 is provided in order to make a connection. As the metallic part 607, materials not readily oxidizable are desirable, and gold and the like are more preferable.

As above, the organic electric field light emitting element of this embodiment is lower in resistivity, and enables to realize a low consumption of electric power and a high efficiency.

Needless to say, the difference which the present embodiment has from Example 4 can appropriately be applied to other embodiments, and the present embodiment does not exhibit its effect only when subordinate to Example 4.

EXAMPLE 7

By providing the organic electric field light emitting elements of the above-mentioned embodiments on a plurality of substrates, a displaying apparatus can be realized. Hereinafter, this embodiment will be mentioned.

Figure 11:
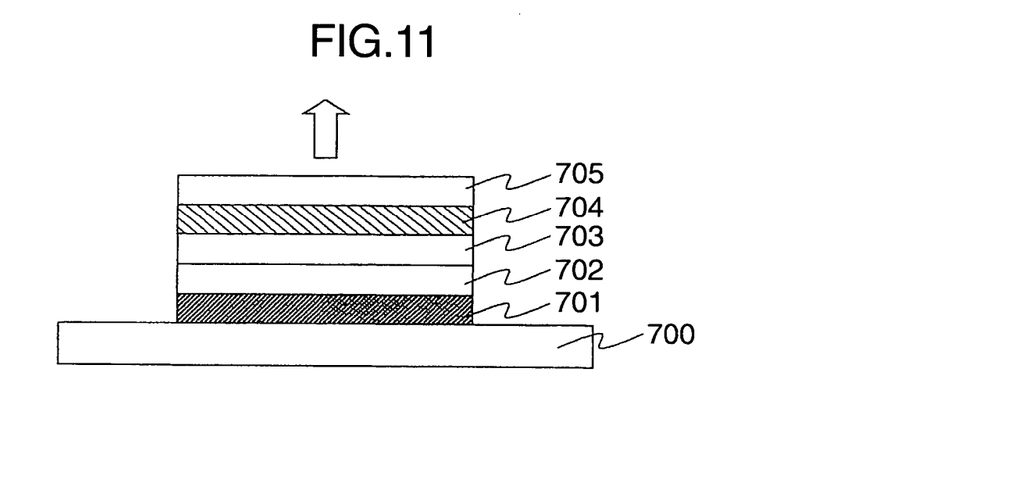
FIG. 11 is a sectional view illustrating a displaying apparatus using an organic electric field light emitting element according to Example 7.

The displaying apparatus according to the present embodiment has a construction shown in FIG. 11. Concretely saying, the apparatus is constituted by successively laminating a substrate 700, a metallic reflecting film 701, a thin film of fluorinated metal 702, a first transparent electrically conductive film 703, a light emitting layer 704 and a second transparent electrically conductive film 705. This structure is a structure for a displaying method called "top emission method". The displaying apparatus having this construction can roughly maintain the state just after formation of the organic electric field light emitting element, retains the reflection characteristics of the metallic film and the transparency and electrical conductivity of the transparent electrically conductive film over a long period of time, and can realize a light emission of high efficiency, similarly to the afore-mentioned Example 1.

Although the displaying apparatus of the present embodiment uses the organic electric field light emitting element of Example 4, it is also possible sufficiently to realize a displaying apparatus of top emission type by using the organic electrical field light emitting elements according to other embodiments.

EXAMPLE 8

The present embodiment illustrates another mode of practice of the displaying apparatus formed by providing a plurality of organic electric field light emitting elements on a substrate.

Figure 12:
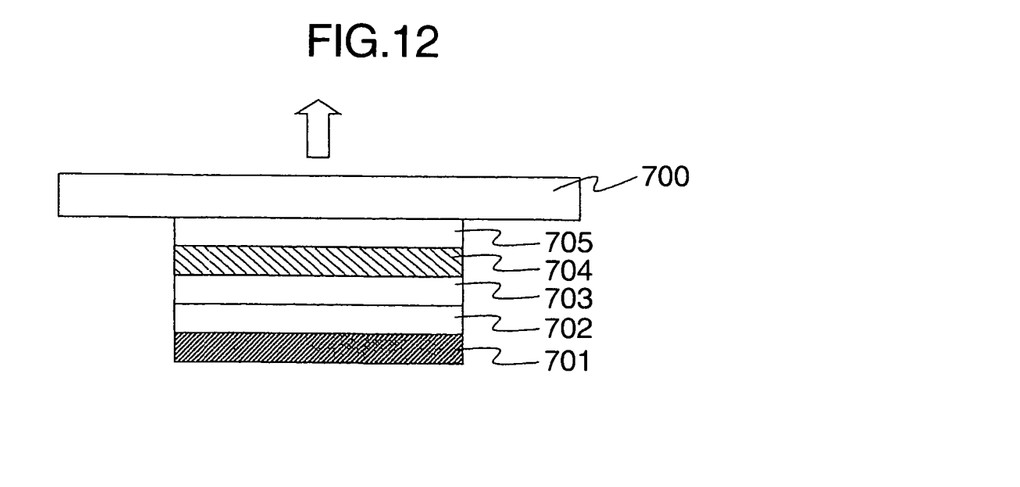
FIG. 12 is a sectional view illustrating a displaying apparatus using an organic electric field light emitting element according to Example 8.

The displaying apparatus of the present embodiment has a construction shown in FIG. 12. Concretely saying, it is constructed by successively laminating a substrate 700, a second transparent electrically conductive film 705, a light emitting layer 704, a first transparent electrically conductive film 703, a thin film of fluorinated metal 702 and a metallic reflecting film 701. According to the explanation presented herein, the first transparent electrically conductive film 703 is mentioned next to the second transparent electrically conductive film 705. However, they are distinguished herein only for facilitating understanding of the location in relation to other embodiments. This structure is the so-called "bottom emission" type of displaying method, wherein the light emitted from the light emitting layer reaches the observer after passing through the substrate 700.

This embodiment also enables to realize a displaying apparatus which roughly maintains the state just after formation of the organic electric field light emitting element, retains reflecting characteristics of the metallic film and transparency and electrical conductivity of the transparent electrically conductive film over a long period of time, and carries out a light emission of high efficiency.

It is needless to say that, although the displaying apparatus of the present embodiment has a construction using the organic electric field light emitting element of Example 4, it is also possible to use the organic electric field light emitting elements of other embodiments. Especially in the case of the displaying apparatus of Example 5, it is also possible to make a structure of successively laminating a substrate, a semi-transparent reflecting film, a second transparent electrically conductive film, a light emitting layer, a first transparent electrically conductive film, a thin film of fluorinated metal and a metallic reflecting film.

EXAMPLE 9

Figure 13A:
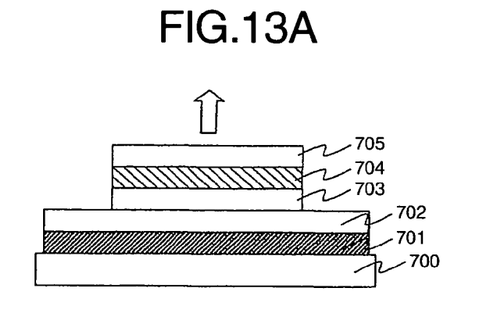
FIG. 13 is a sectional view illustrating an organic electric field light emitting element according to Example 9.
Figure 13B:
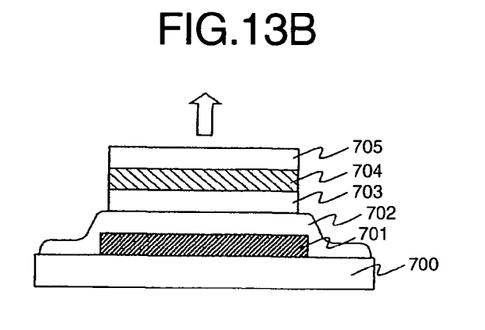

The organic electric field light emitting element of this invention has a metallic reflecting film, and the light incident onto this film is reflected to the side of light emitting layer. In this case, it is useful that the metallic reflecting film uses the light coming from the light emitting layer as efficiently as possible. Thus, it is desirable that the metallic reflecting film has an area at least the same as that of light emitting layer so that the reflecting layer can cover the light emitting layer. This structure will be explained by referring to FIGS. 13A and 13B. In this case, it is desirable that the thin film of fluorinated metal has at least the same area as that of light emitting layer, to cover the light emitting layer, in order to suppress the reaction between the metallic reflecting layer and the transparent electrically conductive film. For example, in FIG. 13A, the metallic reflecting film 701 and the thin film of fluorinated metal 702 are constructed so as to have areas sufficiently broader than that of light emitting layer. In this case, it is especially useful to use these films commonly to a plurality of organic light emitting elements. FIG. 13B illustrates an example in which thin film of fluorinated metal 702 is formed so as to have a sufficiently broader area than that of light emitting layer 704.

EXAMPLE 10

Figure 14A:
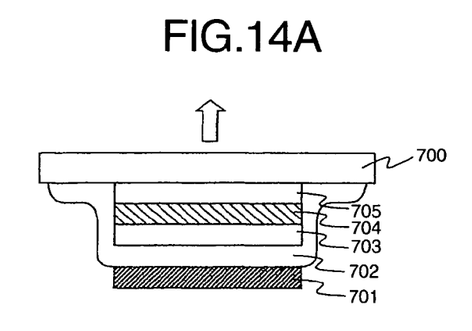
FIG. 14 is a sectional view illustrating an organic electric field light emitting element according to Example 10.
Figure 14B:
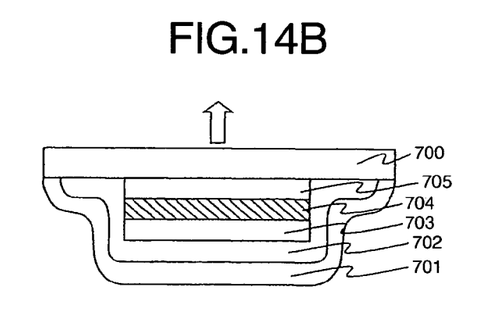

This embodiment is the same as Example 9, and illustrates another form of bottom emission system, as shown in FIGS. 14A and 14B. In FIG. 14A, a thin film of fluorinated metal 702 is formed so as to cover the second transparent electrically conductive film 705, the light emitting layer 704 and the first transparent electrically conductive film 703. In FIG. 14B, the thin film of fluorinated metal 702 and metallic reflecting film 701 are constructed so as to cover the second transparent electrically conductive film 705, the light emitting layer 704 and the first transparent electrically conductive film 703. It is needless to say, in this case, too, to cover the semi-transparent reflecting film in the same manner as above, when the semi-transparent reflecting film is provided between the second transparent electrically conductive film 705 and substrate 700.

EXAMPLE 11

Figure 15:
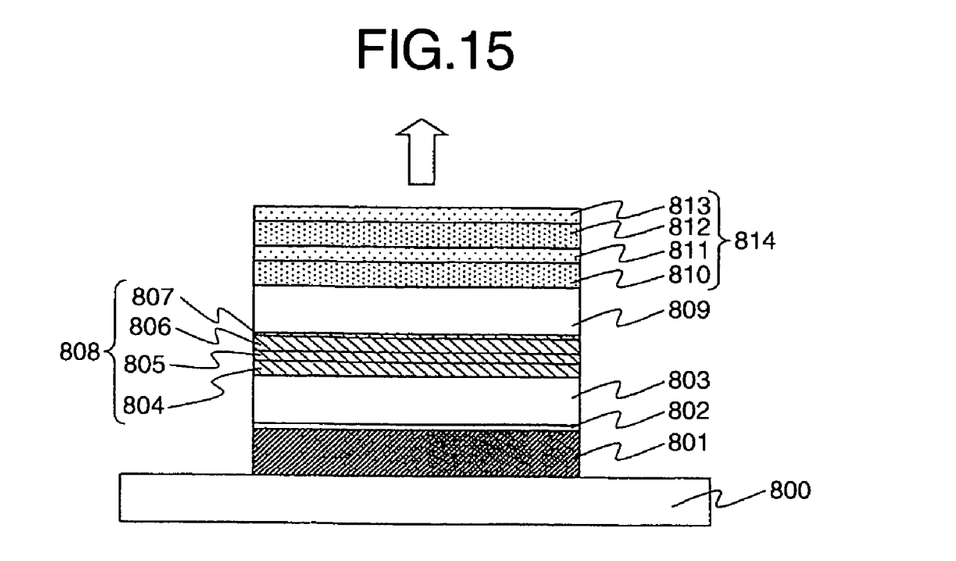
FIG. 15 is a sectional view illustrating a displaying apparatus using an organic electric field light emitting element according to Example 11.
Figure 16:
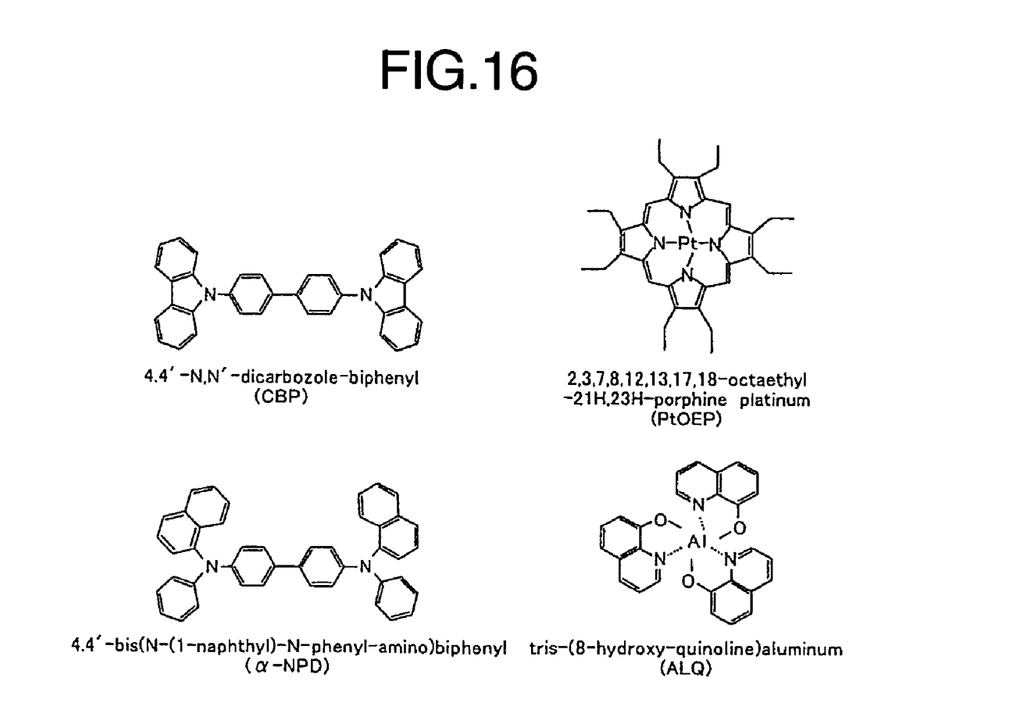
FIG. 16 is a drawing illustrating the molecular structure of the light emitting layer used in Example 11.

FIG. 15 illustrates an displaying apparatus according to the present example. The apparatus of this drawing is a displaying apparatus of the so-called top emission type, and is constructed from a substrate 800, a metallic reflecting film 801 consisting of an aluminum film having a film thickness of 150 nm, a thin film of fluorinated metal 802 consisting of lithium fluoride (LiF) having a film thickness of 10 nm, a first transparent electrically conductive film 803 consisting of ITO having a film thickness of 150 nm; a light emitting layer 808 consisting of the following four layers: a hole injecting layer 804 consisting of a-NPD having a film thickness of 40 nm, a light emitting material layer 805 consisting of CBP into which is mixed 6% by volume of PtOEP and having a film thickness of 20 nm, an electron transporting layer 806 consisting of ALQ (alumiquinoline) having a film thickness of 50 nm, and an electron injecting layer 807 consisting of LiF having a film thickness of 1 nm; and a second transparent electrically conductive film 809 consisting of ITO having a film thickness of 140 nm; and a semi-transparent reflecting layer 814 which is a laminated product of the following four layers: silicon oxide 810 having a film thickness of 89 nm, titanium oxide 811 having a film thickness of 56 nm, silicon oxide 812 having a film thickness of 89 nm and titanium oxide 813 having a film thickness of 56 nm. Due to this construction, the displaying apparatus of this example causes emission of light when a direct current is applied between the first and second transparent electrodes. FIG. 16 illustrates the materials in the above-mentioned light emitting layer.

As the conditions determining the film thickness of the first and second transparent electrically conductive films, the life-time and diffusion distance of exciton and the optical distance between semi-transparent reflecting layer and metallic reflecting film for making the organic electric field light emitting element function as a vibrator structure can be referred to. When the film thickness of transparent electrically conductive film is thicker, the proportion of exciton disappearing without light emission can be more decreased. However, if the film thickness is excessively large, the function as a vibrator can be lost. It should be taken into consideration that the upper limit of the thickness is about five times as large as the peak wavelength. In the present example, the first transparent electrically conductive film 803 had a thickness of 150 nm, and it was ascertained by a photo luminescence measurement that the life-time of light emission was roughly constant regardless of the presence or absence of metallic film.

As has been mentioned above, according to the present example, there can be realized a displaying apparatus using an organic electric field light emitting element which can roughly maintain the state just after formation of the organic electric field light emitting element, retains the reflection characteristics of the metallic film and the transparency and electrical conductivity of the transparent electrically conductive film over a long period of time, and carries out a light emission of high efficiency.

In the present example, the semi-transparent reflecting layer 814 can be omitted from the construction, if the function as a vibrator is not desired. Further, it is sufficiently possible to realize a displaying apparatus of bottom emission type by applying this example.

Further, it is also possible to apply a triplet light excited state to the light emitting layer of an organic electric field light emitting element. In this case, the life-time of exciton is long, and the present invention functions more usefully. All the materials hitherto known are longer than 1 microsecond as expressed in the term of 1/e decrease characteristic time of fluorescent strength.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An organic light emitting element using a light-emitting molecules having a relaxation time of excited state is 1 μs or more, the element comprising an anode, a cathode and a light-emitting film provided between the anode and the cathode, wherein both of the anode and the cathode are transparent electrically conductive films, a pair of reflecting films are provided on each side of both the anode and cathode opposite to the side which faces the light-emitting film, one of the reflecting films is a metallic reflection film, and the gap between the reflecting films has function as light vibrator.

2. An organic light emitting element according to claim 1, wherein the element further comprises a metallic reflection gloss retaining low reactivity film between the metallic reflection film and the transparent electrically conductive film.

3. An organic light emitting element according to claim 2, wherein the metallic reflecting film is a chromium film composed of chromium and the metallic reflection gloss retaining low reactivity film is a silicon nitride film composed of silicon nitride.

4. An organic light emitting element according to claim 1, which further comprises a pair of substrates which sandwich the reflecting films, space is formed between one of the substrates and one of the reflecting films, the other of the substrates is in contact with the other of the reflecting films.

5. An organic light emitting element using a light-emitting molecules utilizing triplet excited state, the element comprising an anode, a cathode and a light-emitting film provided between the anode and the cathode, wherein both of the anode and the cathode are transparent electrically conductive films, a pair of reflecting films are provided on each side of both the anode and cathode opposite to the side which faces the light-emitting film, one of the reflecting films is a metallic reflection film, and the gap between the reflecting films has function as light vibrator.

6. An organic light emitting element according to claim 5, wherein the element further comprises a metallic reflection gloss retaining low reactivity film between the metallic reflection film and the transparent electrically conductive film.

7. An organic light emitting element according to claim 6, wherein the metallic reflecting film is a chromium film composed of chromium and the metallic reflection gloss retaining low reactivity film is a silicon nitride film composed of silicon nitride.

8. An organic light emitting element according to claim 5, which further comprises a pair of substrates which sandwich the reflecting films, space is formed between one of the substrates and one of the reflecting films the other of the substrates is in contact with the other of the reflecting films.

* * * * *